United States Patent
Bobek et al.

(10) Patent No.: US 12,100,609 B2
(45) Date of Patent: Sep. 24, 2024

(54) ELECTROSTATIC CHUCKING PROCESS

(71) Applicant: Applied Materials, Inc., Santa Clara, CA (US)

(72) Inventors: Sarah Michelle Bobek, Sunnyvale, CA (US); Venkata Sharat Chandra Parimi, Santa Clara, CA (US); Prashant Kumar Kulshreshtha, San Jose, CA (US); Kwangduk Douglas Lee, Redwood City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 652 days.

(21) Appl. No.: 16/848,553

(22) Filed: Apr. 14, 2020

(65) Prior Publication Data

US 2020/0328063 A1    Oct. 15, 2020

Related U.S. Application Data

(60) Provisional application No. 62/834,162, filed on Apr. 15, 2019.

(51) Int. Cl.
*H01L 21/683* (2006.01)
*H01J 37/32* (2006.01)
(Continued)

(52) U.S. Cl.
CPC .... *H01L 21/6831* (2013.01); *H01J 37/32082* (2013.01); *H01J 37/32146* (2013.01);
(Continued)

(58) Field of Classification Search
None
See application file for complete search history.

(56) References Cited

U.S. PATENT DOCUMENTS 5,997,962 A    12/1999  Ogasawara et al.
6,057,244 A *  5/2000  Hausmann ........ H01J 37/32137
                                                    438/711
(Continued)

FOREIGN PATENT DOCUMENTS

CN    102187432 A    9/2011
CN    107546168 A    1/2018
(Continued)

OTHER PUBLICATIONS

Marion, Jason et al, Dec. 2017, translation of "Method and apparatus for ESC charge control for wafer clamping", Korean Intellectual Property Office (Year: 2017).*

(Continued)

*Primary Examiner* — Christopher A Johnson
(74) *Attorney, Agent, or Firm* — Patterson + Sheridan, LLP

(57) ABSTRACT

One or more embodiments described herein generally relate to methods for chucking and de-chucking a substrate to/from an electrostatic chuck used in a semiconductor processing system. Generally, in embodiments described herein, the method includes: (1) applying a first voltage from a direct current (DC) power source to an electrode disposed within a pedestal; (2) introducing process gases into a process chamber; (3) applying power from a radio frequency (RF) power source to a showerhead; (4) performing a process on the substrate; (5) stopping application of the RF power; (6) removing the process gases from the process chamber; and (7) stopping applying the DC power.

17 Claims, 6 Drawing Sheets

(51) Int. Cl.
*H01L 21/02* (2006.01)
*H01L 21/3213* (2006.01)
*C23C 16/02* (2006.01)
*C30B 33/12* (2006.01)
*H01L 21/3065* (2006.01)

(52) U.S. Cl.
CPC .. *H01J 37/32449* (2013.01); *H01J 37/32743* (2013.01); *H01L 21/02274* (2013.01); *H01L 21/02315* (2013.01); *H01L 21/0234* (2013.01); *H01L 21/32136* (2013.01); *H01L 21/6833* (2013.01); *C23C 16/0245* (2013.01); *C30B 33/12* (2013.01); *H01J 2237/036* (2013.01); *H01J 2237/32* (2013.01); *H01L 21/02252* (2013.01); *H01L 21/3065* (2013.01)

(56) References Cited

U.S. PATENT DOCUMENTS

| | | | |
|---|---|---|---|
| 7,224,568 | B2 | 5/2007 | Ishimura et al. |
| 7,541,283 | B2 * | 6/2009 | Shindo .............. H01J 37/32082 438/680 |
| 8,012,304 | B2 | 9/2011 | Brillhart et al. |
| 8,021,521 | B2 | 9/2011 | Buchberger, Jr. et al. |
| 8,092,639 | B2 | 1/2012 | Buchberger, Jr. et al. |
| 8,105,465 | B2 | 1/2012 | Lee et al. |
| 8,221,580 | B2 | 7/2012 | Buchberger, Jr. et al. |
| 8,277,673 | B2 | 10/2012 | Tsujimoto et al. |
| 8,329,586 | B2 | 12/2012 | Buchberger, Jr. et al. |
| 8,546,267 | B2 | 10/2013 | Brillhart et al. |
| 8,608,900 | B2 | 12/2013 | Buchberger, Jr. et al. |
| 8,691,708 | B2 | 4/2014 | Kaga et al. |
| 8,980,044 | B2 | 3/2015 | Brillhart et al. |
| 10,431,462 | B2 | 10/2019 | Kim et al. |
| 10,714,345 | B2 | 7/2020 | Kim et al. |
| 10,832,936 | B2 | 11/2020 | Woytowitz et al. |
| 2004/0102025 | A1 * | 5/2004 | Arita ................... H01L 21/3065 257/E21.256 |
| 2006/0046506 | A1 | 3/2006 | Fukiage |
| 2006/0171093 | A1 | 8/2006 | Ishimura et al. |
| 2007/0089834 | A1 | 4/2007 | Brillhart et al. |
| 2007/0091537 | A1 | 4/2007 | Buchberger et al. |
| 2007/0091538 | A1 | 4/2007 | Buchberger et al. |
| 2007/0091539 | A1 | 4/2007 | Buchberger et al. |
| 2007/0091540 | A1 | 4/2007 | Brillhart et al. |
| 2007/0091541 | A1 | 4/2007 | Buchberger et al. |
| 2008/0138535 | A1 | 6/2008 | Hwang |
| 2010/0025372 | A1 * | 2/2010 | Tsujimoto ......... H01J 37/32091 156/345.28 |
| 2010/0093187 | A1 | 4/2010 | Lee et al. |
| 2010/0314046 | A1 | 12/2010 | Brillhart et al. |
| 2010/0319851 | A1 | 12/2010 | Buchberger, Jr. et al. |
| 2011/0065279 | A1 | 3/2011 | Buchberger, Jr. et al. |
| 2011/0068085 | A1 | 3/2011 | Brillhart et al. |
| 2013/0059071 | A1 | 3/2013 | O'Donnell |
| 2016/0027620 | A1 | 1/2016 | Marion et al. |
| 2016/0064264 | A1 | 3/2016 | Kulshreshtha et al. |
| 2018/0033672 | A1 | 2/2018 | Woytowitz et al. |
| 2018/0144946 | A1 | 5/2018 | Voronin et al. |
| 2018/0148835 | A1 | 5/2018 | Erickson et al. |
| 2018/0233365 | A1 | 8/2018 | Kim et al. |
| 2018/0366360 | A1 | 12/2018 | Hirai et al. |
| 2019/0198299 | A1 * | 6/2019 | Watanabe ......... H01L 21/67115 |
| 2019/0221464 | A1 | 7/2019 | Sasaki et al. |
| 2019/0393034 | A1 * | 12/2019 | Venkatasubramanian ................... H01L 21/0332 |
| 2020/0020537 | A1 | 1/2020 | Kim et al. |
| 2022/0119954 | A1 * | 4/2022 | Chen ................. H01J 37/32146 |
| 2022/0380894 | A1 | 12/2022 | Gaff et al. |

FOREIGN PATENT DOCUMENTS

| | | | | |
|---|---|---|---|---|
| CN | 108335993 | A | | 7/2018 |
| JP | 2004172364 | A | | 6/2004 |
| JP | 2006210726 | A | | 8/2006 |
| JP | 2007116098 | A | | 5/2007 |
| JP | 4322484 | B2 | | 9/2009 |
| JP | 2010040627 | A | | 2/2010 |
| KR | 101809788 | B1 * | 12/2017 | ........ H01J 37/32697 |
| TW | 201816177 | A | | 5/2018 |
| TW | 201841229 | A | | 11/2018 |
| WO | 2010045153 | A2 | | 4/2010 |
| WO | 2017100136 | A1 | | 6/2017 |

OTHER PUBLICATIONS

International Search Report and Written Opinion dated Jul. 30, 2020 for Application No. PCT/US2020/028146.
Office Action for Taiwan Application No. 109112471 dated Feb. 27, 2024.
Search Report for Taiwan Application No. 109112471 dated Feb. 23, 2024.
Search Report and Written Opinion for Singapore Application No. 11202110823V dated Jan. 5, 2024.
Office Action for Chinese Application No. 202080030601.0 dated Dec. 28, 2023.
Search Report for Chinese Application No. 202080030601.0 dated Dec. 28, 2023.
Office Action for Japanese Application No. 2021-560249 dated Jun. 11, 2024.

* cited by examiner

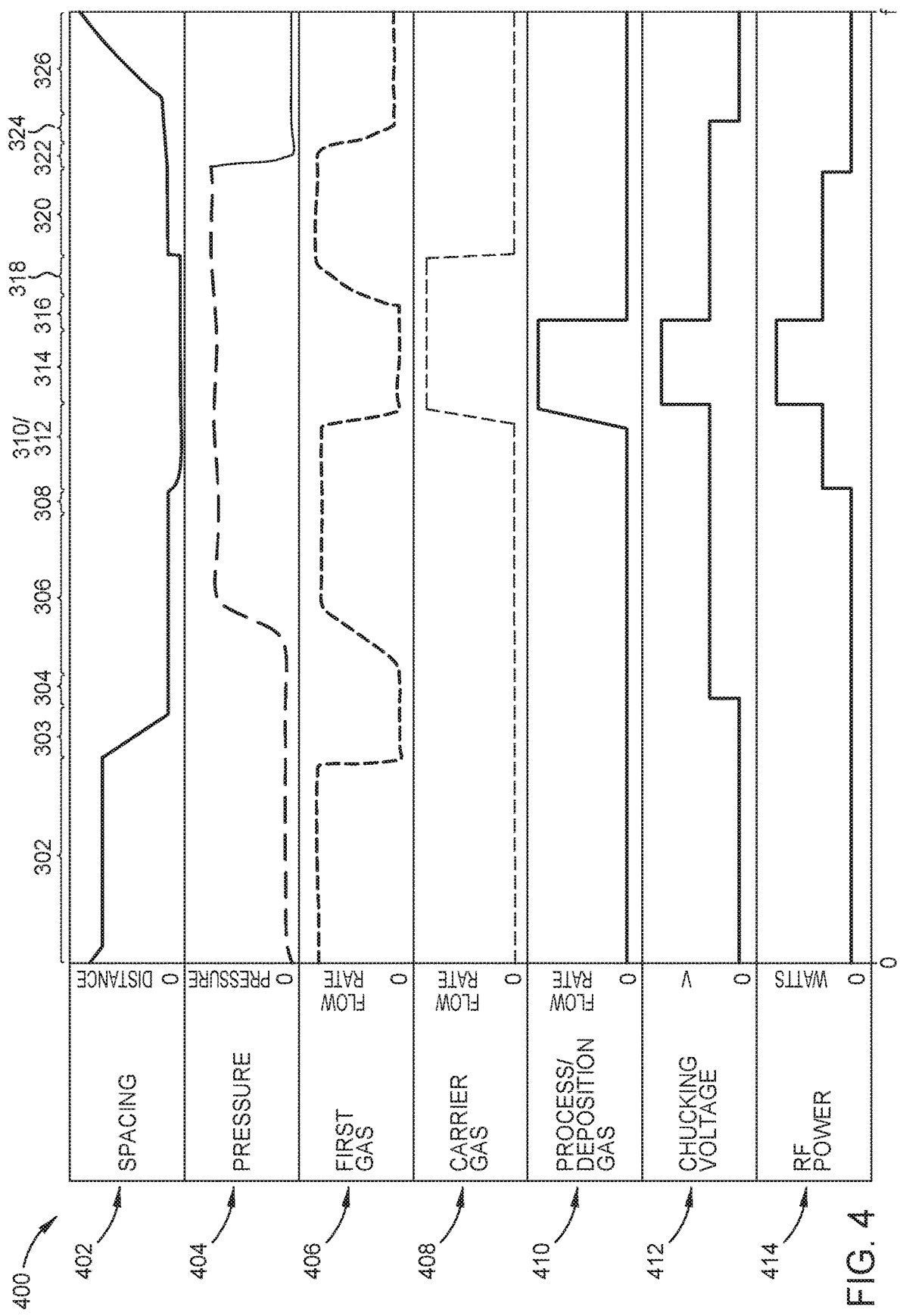

ELECTROSTATIC CHUCKING PROCESS

CROSS-REFERENCE TO RELATED APPLICATIONS

This application claims priority to U.S. Provisional Patent Application Ser. No. 62/834,162 filed on Apr. 15, 2019, which herein is incorporated by reference.

BACKGROUND

Field

One or more embodiments described herein generally relate to semiconductor processing systems, and more particularly, to methods for chucking and de-chucking a substrate to/from an electrostatic chuck used in a semiconductor processing system.

Description of the Related Art

Electrostatic chucking (ESC) pedestals, commonly known as electrostatic chucks, are used in semiconductor device manufacturing to securely hold a substrate in a processing position within a processing volume of a process chamber, using an electrostatic chucking force. The chucking force is a function of the potential between a DC voltage provided to a chucking electrode embedded in a dielectric material of the pedestal and a substrate disposed on a surface of the dielectric material.

In the manufacture of semiconductor devices, integrated circuits have evolved into complex devices that can include millions of transistors, capacitors, and resistors on a single chip. The evolution of chips designs continually require greater circuit density, which will result in an increased substrate bow of a multi-stack structure. Flattening the substrate to the surface of the pedestal facilitates securing the substrate during plasma processes and ensures correct radio frequency (RF) coupling to ground for chamber longevity and uniform film deposition. Loss of chucking becomes a risk as the distance of the substrate from the chucking electrode increases. As such, a higher electrostatic chucking voltage is necessary to clamp the substrate to the pedestal surface. The higher electrostatic chucking voltage may cause a DC plasma discharge adjacent to the substrate. The DC plasma discharge may damage the substrate during processing.

Furthermore, the evolution of chip designs have led to modified pedestal surface designs that include multiple points where the substrate contacts the pedestal surface, commonly referred to as posts. However, although the posts desirably provide repeatable contact to minimize particle defects on the substrate backside, due to the modified structure of the pedestal surface, in conventional processes, the substrate can often become damaged or break. The posts may induce damage at a higher rate for increased electrostatic chucking voltage and when the position of the substrate is not adequately controlled. Damages on the substrate backside at the posts result in lithographic defocus, and significantly impact production yield.

Accordingly, there is a need for methods of chucking and de-chucking a substrate to an electrostatic chuck that reduce lithographic defocus and yield loss by eliminating backside damages.

SUMMARY

One or more embodiments described herein generally relate to methods for chucking and de-chucking a substrate to/from an electrostatic chuck used in a semiconductor processing system.

In one embodiment, a method for processing a substrate within a process chamber includes applying a direct current to an electrode disposed within a pedestal on which the substrate is disposed within the process chamber; flowing one or more process gases into the process chamber subsequent to applying the direct current to the electrode; applying radio frequency (RF) power to a showerhead within the process chamber, subsequent to flowing one or more process gases into the process chamber; processing the substrate subsequent to applying RF power; stopping the application of the RF power subsequent to processing the substrate; removing the one or more process gases from the process chamber subsequent to stopping the application of RF power; and stopping the application of the DC power subsequent to removing the one or more process gases.

In another embodiment, a method for processing a substrate includes (a) positioning the substrate on a surface of a pedestal, wherein the pedestal is at a first spacing from a showerhead, (b) applying a DC voltage at a first DC voltage level to an electrode disposed within the pedestal, (c) flowing one or more process gases into the process chamber through the showerhead, (d) applying an RF power at a first RF power level to the showerhead within the process chamber, (e) increasing the DC voltage and the RF power to a second DC voltage level and a second RF power level either prior to, during, or both prior to and during processing of the substrate, (f) decreasing the DC voltage and the RF power to a third DC voltage level and a third RF power level after processing of the substrate, (g) moving the pedestal within the process chamber to a second spacing from the showerhead, (h) stopping the application of RF power to the showerhead, (i) removing the one or more process gases from the process chamber, and (j) stopping the application of the DC voltage to the electrode.

In yet another embodiment, a method for processing a substrate includes positioning the substrate on a surface of a pedestal, wherein the pedestal is at a first spacing from a showerhead within a process chamber; applying a DC voltage at a first DC voltage level to an electrode disposed within the pedestal; flowing a first process gas into the process chamber through the showerhead after the application of the DC voltage at a first DC voltage level; applying radio frequency (RF) power to the showerhead within the process chamber at a first RF power level; moving the pedestal to a second spacing from the showerhead, wherein the second spacing is closer to the showerhead than the first spacing; flowing a second process gas mixture into the process chamber through the showerhead; increasing the DC voltage and the RF power to a second DC voltage level and a second RF power level to either prior to, during, or both prior to and during the performance of a process on the substrate; decreasing the DC voltage and the RF power after performing the process on the substrate to a third DC voltage level and a third RF power level; flowing the first process gas into the process chamber through the showerhead while removing the second process gas mixture from the process chamber after performing the process on the substrate; moving the pedestal within the process chamber to a third spacing from the showerhead; stopping the application of the RF power; removing the first process gas from the process chamber after stopping the application of the RF power; and stopping the application of the DC power after removing the first process gas from the process chamber.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 4 is a graph illustrating process parameter relations at operations within the methods disclosed herein.

DETAILED DESCRIPTION

Figure 1:
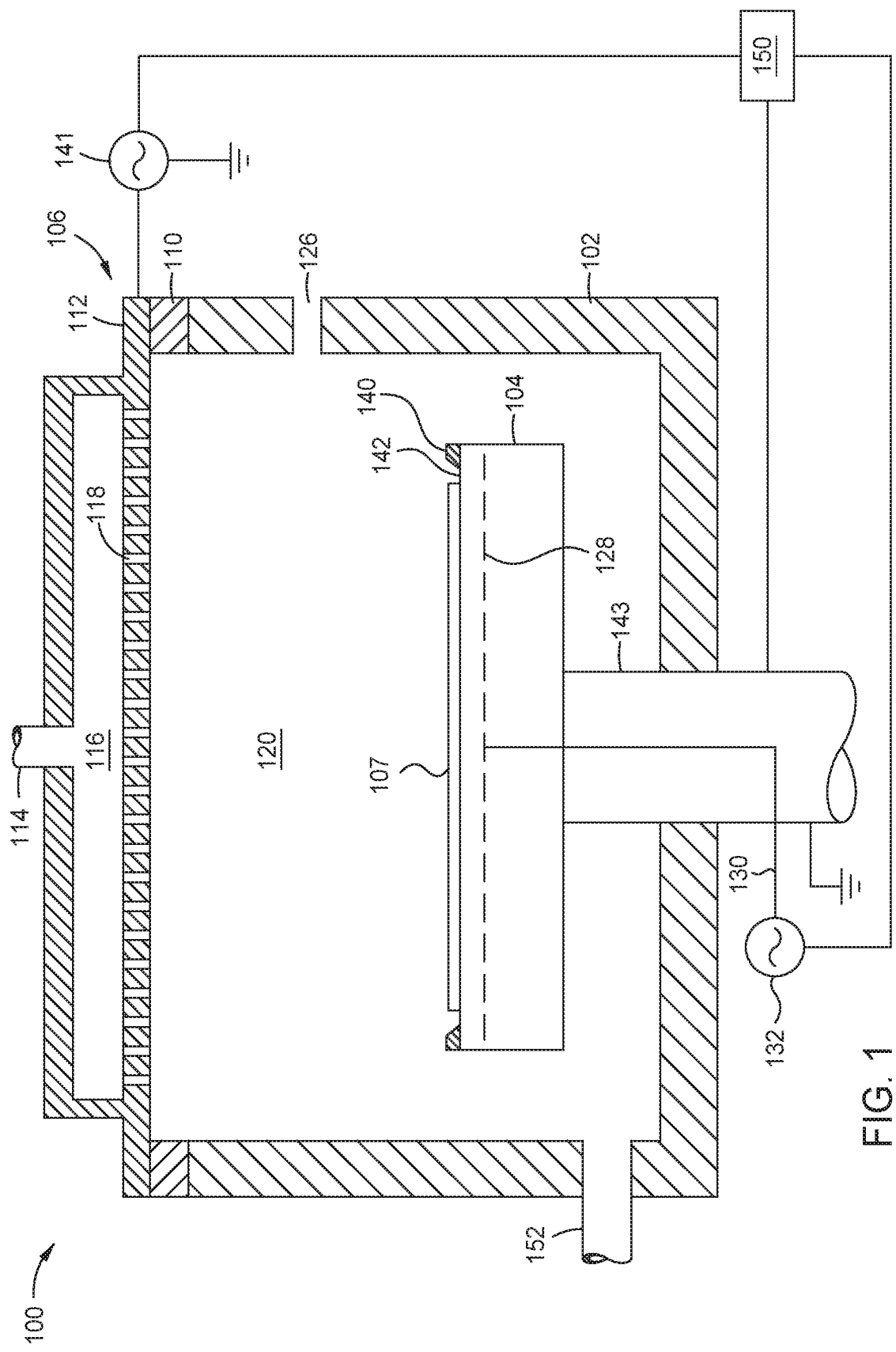
FIG. 1 is a schematic cross-sectional view of a process chamber according to at least one embodiment described herein.

In the following description, numerous specific details are set forth to provide a more thorough understanding of the embodiments of the present disclosure. However, it will be apparent to one of skill in the art that one or more of the embodiments of the present disclosure may be practiced without one or more of these specific details. In other instances, well-known features have not been described in order to avoid obscuring one or more of the embodiments of the present disclosure.

One or more embodiments described herein generally relate to methods for chucking and de-chucking a substrate to/from an electrostatic chuck used in a semiconductor processing system. In embodiments described herein, pedestals within process chambers have modified pedestal surfaces that include multiple points where the substrate contacts the pedestal surface, commonly referred to as posts. In conventional methods for chucking a substrate to the modified pedestal surface, a first process gas is introduced into the process chamber. A radio frequency (RF) power is then generated from an RF power source, generating an RF plasma within the process chamber. Thereafter, a direct current (DC) voltage is generated from a DC power source to an electrode disposed within the pedestal to apply a DC electrostatic chucking bias, chucking the substrate to the pedestal surface via an electrostatic chucking force. Subsequent to the chucking of the substrate, a process is performed on the substrate within the process chamber. Subsequent the process, the DC electrostatic chucking is turned off and then the RF power is turned off. Once the DC electrostatic chucking and RF power are off, the gas flow into the process chamber is stopped.

However, the conventional methods described above create a high degree of movement for the substrate at the introduction of gases without the chucking force present, which can lead to substrate breakage. Additionally, in the conventional methods, backside damages may occur as the substrate undergoes force that moves the substrate with respect to the posts on the pedestal surface. The force can be due to the movement or due to thermal expansion. In the case of thermal expansion, the difference between the temperature of the pedestal surface and the pedestal surface at the posts can cause localized damages as the substrate expands or contracts with respect to the pedestal surface.

In the methods for chucking a substrate to the modified pedestal surface as described in embodiments herein, a DC voltage is first generated from a direct current (DC) power source to an electrode disposed within the pedestal, chucking the substrate to the pedestal surface via an electrostatic chucking force. After the substrate is chucked with an electrostatic chucking force, a first process gas may be introduced into the process chamber. After the first process gas is introduced, RF power is generated from an RF power source, generating an RF plasma within the process chamber. Applying the chucking force prior to RF plasma generation advantageously controls the position of the substrate, preventing the substrate from breaking or being damaged by unintentional movement of the substrate on the pedestal surface during the introduction of the first process gas. Additionally, first applying the chucking force improves yield by reducing lithographic defocus by eliminating backside damages.

After RF power is applied to generate the RF plasma, a process is performed on the substrate. The process may be a deposition process, etch process, plasma treatment, or another process. Subsequent the performance of the process on the substrate, the RF power is turned off. After the RF power is turned off, the first process gas ceases being flown into the process chamber. Subsequent the ceasing of the gas flow, the electrostatic chucking force is turned off before removal of the substrate from the processing chamber.

Overall, in embodiments described herein, the methods generally apply the following sequence: (1) apply a first voltage from a direct current (DC) power source to an electrode disposed within the pedestal; (2) introduce process gases into the process chamber; (3) apply a second voltage from an RF power source; (4) perform a deposition (or other) process on the substrate; (5) stop applying the second voltage from the RF power source; (6) remove the process gases from the process chamber; and (7) stop applying the DC power from the DC power source.

FIG. 1 is a schematic cross-sectional view of a processing chamber 100 according to one embodiment described herein. The processing chamber 100 is a plasma enhanced chemical vapor deposition (PECVD), but it is contemplated that other process chambers may benefit from aspects described herein. An exemplary process chamber which may benefit from the embodiments described herein is the PRODUCER® series of PECVD enabled chambers, available from Applied Materials, Inc., Santa Clara, CA. It is contemplated that other similarly equipped process chambers, including those from other manufacturers, may also benefit from the embodiments described herein.

The process chamber 100 includes a chamber body 102, a pedestal 104 disposed inside the chamber body 102, and a lid assembly 106 coupled to the chamber body 102 and enclosing the pedestal 104 in a processing region 120. The lid assembly 106 includes a gas distributor 112. A substrate 107 is provided to the processing region 120 through an opening 126, such as a slit valve, formed in the chamber body 102.

An isolator 110, which is a dielectric material such as a ceramic or metal oxide, for example aluminum oxide and/or aluminum nitride, separates the gas distributor 112 from the chamber body 102. The gas distributor 112 includes openings 118 for admitting process gases into the processing region 120. The process gases are supplied to the process chamber 100 via a conduit 114, and the process gases enter a gas mixing region 116 prior to flowing through the openings 118. An exhaust 152 is formed in the chamber body 102 at a location below the pedestal 104. The exhaust 152 may be connected to a vacuum pump (not shown) to remove unreacted species and by-products from the process chamber 100.

The gas distributor 112 is coupled to a power source 141, such as an RF generator. The power source 141 supplies continuous and/or pulsed RF power to the gas distributor 112. The power source 141 is turned on during operation to supply an electric power to the gas distributor 112 to facilitate formation of a plasma in the processing region 120.

The pedestal 104 is formed from a ceramic material, for example a metal oxide or nitride or oxide/nitride mixture such as aluminum, aluminum oxide, aluminum nitride, or an aluminum oxide/nitride mixture. The pedestal 104 is supported by a shaft 143. The pedestal 104 is electrically grounded. An electrode 128 is embedded in the pedestal 104. The electrode 128 may be a plate, a perforated plate, a mesh, a wire screen, or any other distributed arrangement. The electrode 128 is coupled to an electric power source 132 via a connection 130. The electric power source 132 supplies power to the electrode 128. In some embodiments, the electrode 128 facilitates electrostatic chucking of the substrate 107, such that the pedestal 104 functions as an electrostatic chuck. When the electrode 128 functions as an electrostatic chuck, the electric power source 132 may be utilized to control properties of the plasma formed in the processing region 120, or to facilitate generation of the plasma within the processing region 120. The pedestal 104 includes a patterned surface 142 for supporting the substrate 107. The pedestal 104 also includes a pocket 140. The pocket 140 may alternatively be an edge ring. The substrate 107 and the pocket 140 are concentrically disposed on the surface 142 of the pedestal 104.

The power source 141, the pedestal 104, and the electric power source 132 may all be connected to a controller 150. The controller 150 controls the application of power to each of the power source 141, the pedestal 104, and the electric power source 132. The controller 150 may increase or decrease the power supplied to each of the power source 141, the pedestal 104, and the electric power source 132. The controller 150 may integrate the utilization of the power source 141, the pedestal 104, and the electric power source 132, such that the supply of power to each of the power source 141, the pedestal 104, and the electric power source 132 are coordinated. In some embodiments, each of the power source 141, the pedestal 104, and the electric power source 132 may be connected to individual controllers 150. In the embodiment in which each of the power source 141, the pedestal 104, and the electric power source 132 are connected to different controllers, each of the controllers 150 may communicate with one another through either a wired or wireless connection.

Figure 2A:
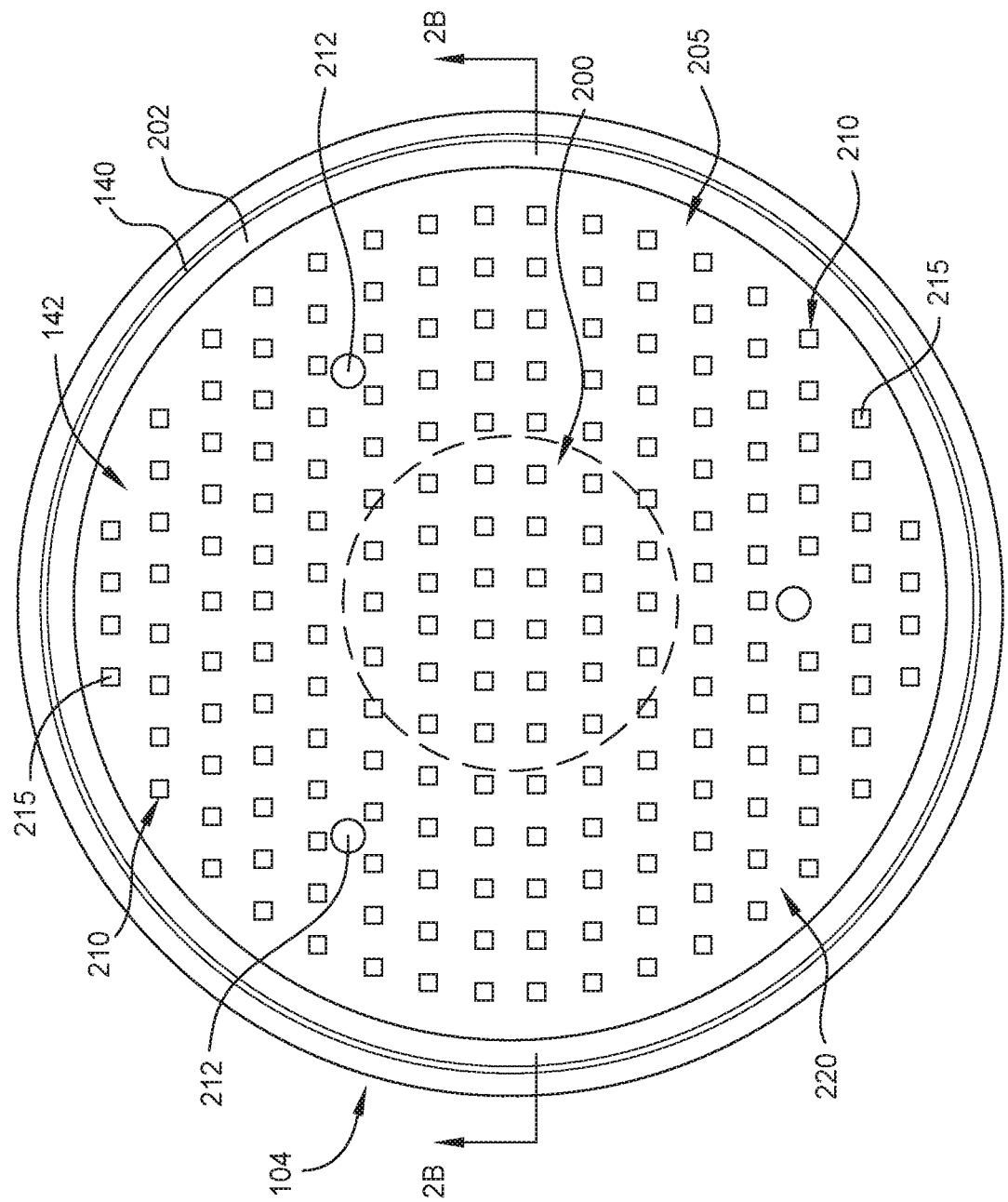
FIG. 2A is a top plan view of the patterned surface of the pedestal of FIG. 1 according to at least one embodiment described herein.

FIG. 2A is a top plan view of the pedestal 104 of FIG. 1 having one embodiment of a patterned surface 142. The pedestal 104 shown in FIG. 2A includes a peripheral ledge 202 that is surrounded by the pocket 140. The patterned surface 142 includes two distinct regions, such as a central region 200 surrounded by a peripheral region 205. The patterned surface 142 includes a plurality of posts 210 that have an upper surface 215 that defines a substrate receiving surface 220. The posts 210 within the central region 200 may have different heights than the posts 210 within the peripheral region 205. The upper surface 215 of each of the plurality of posts 210 are substantially coplanar. The relative heights of the posts 210 within the central region 200 and the peripheral region 205 are shown in greater detail in FIG. 2B.

Each of the plurality of posts 210 are shown as being rectangular in plan view, but the posts 210 may be circular, oval, hexagonal, or other shape in plan view. In some embodiments, which may be combined with other embodiments, the central region 200 has a surface area less than a surface area of the peripheral region 205. For example, if the diameter of the patterned surface 142 is about 12 inches, the surface area of the peripheral region 205 is about 113 square inches, and the surface area of the central region 200 is about 11 square inches. In some embodiments, which may be combined with other embodiments, the surface area of the peripheral region 205 is about 900% greater than a surface area of the central region 200. The upper surface 215 of each of the plurality of posts 210 includes a surface roughness (average surface roughness or Ra) of about 20 micro inches to about 60 micro inches, such as about 30 micro inches to about 50 micro inches or about 35 micro inches to about 45 micro inches. In some embodiments, the upper surface 215 of each of the plurality of posts 210 includes a surface roughness of about 40 micro inches. The patterned surface 142 also includes lift pin holes 212. The lift pin holes 212 are positioned within the peripheral region of the patterned surface 142 and are spaced between the posts 210. The lift pin holes 212 are used along with respective lift pins (not shown) to lower and raise the substrate during transfer to/from the process chamber 100.

Figure 2B:
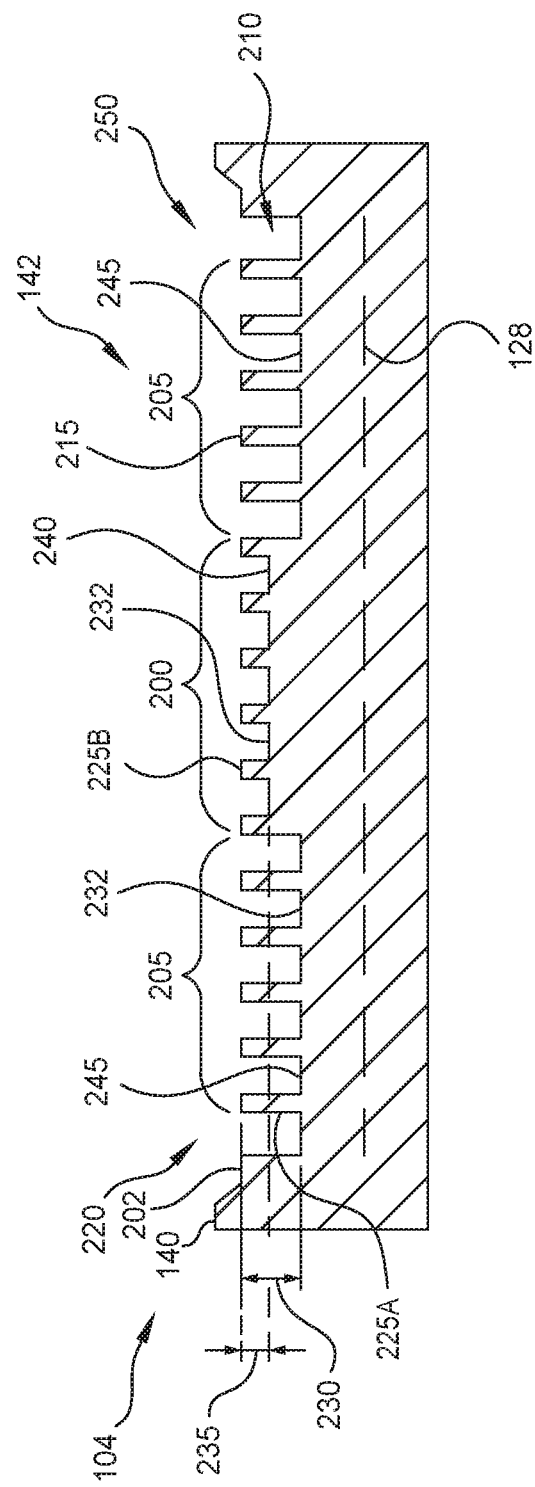
FIG. 2B is a cross sectional view of the pedestal of FIG. 2A according to at least one embodiment described herein.

FIG. 2B is a sectional view of the pedestal 104 of FIG. 2A. As shown in FIG. 2B, the plurality of posts 210 includes a plurality of first posts 225A in the peripheral region 205 and a plurality of second posts 225B in the central region 200. A height 230 of each of the plurality of first posts 225A is greater than a height 235 of the plurality of second posts 225B. The height 230 and the height 235 are measured from an upper surface or base surface 232 of the pedestal 104. In some embodiments, the height 230 of each of the plurality of first posts 225A is about 0.002 inches to about 0.0024 inches, such as about 0.0022 inches. In some embodiments, which may be combined with other embodiments, the height 235 of each of the plurality of second posts 225B is about 0.0005 inches to about 0.0007 inches, such as about 0.0006 inches. While only two different heights of the posts 210 are shown (i.e., height 230 and height 235), the patterned surface 142 may include another plurality of posts at a height that is different than the height 230 and the height 235.

The difference in the heights 230 and 235, and/or the difference in the surface areas of the central region 200 and the peripheral region 205, changes heat transfer rates between the pedestal 104 and a pedestaled thereon. The modified heat transfer rates modify the temperature profile of the substrate. In some embodiments, the difference in the heights 230 and 235, and/or the difference in the surface areas of the central region 200 and the peripheral region 205 improves temperature uniformity in the substrate which improves deposition uniformity on the substrate. In some embodiments, having the height 235 of each of the plurality of second posts 225B that is less than the height 230 of each of the plurality of first posts 225A increases temperature in the center of a substrate. Increasing the temperature at a center of the substrate may improve the temperature uniformity of the entire substrate, which improves deposition uniformity on the substrate.

The heights 230 and 235 of the posts 210 make the base surface 232 of the pedestal 104 a multi-level structure. For example, the base surface 232 of the central region 200 defines a raised surface 240 as compared to the base surface 232 of the peripheral region 205, which is referenced as a recessed surface 245 compared to the raised surface 240. The raised surface 240 and the recessed surface 245 of the pedestal 104 shown in FIG. 2B defines a profile, such as an upside-down or reverse U-shaped profile 250.

Figure 3A:
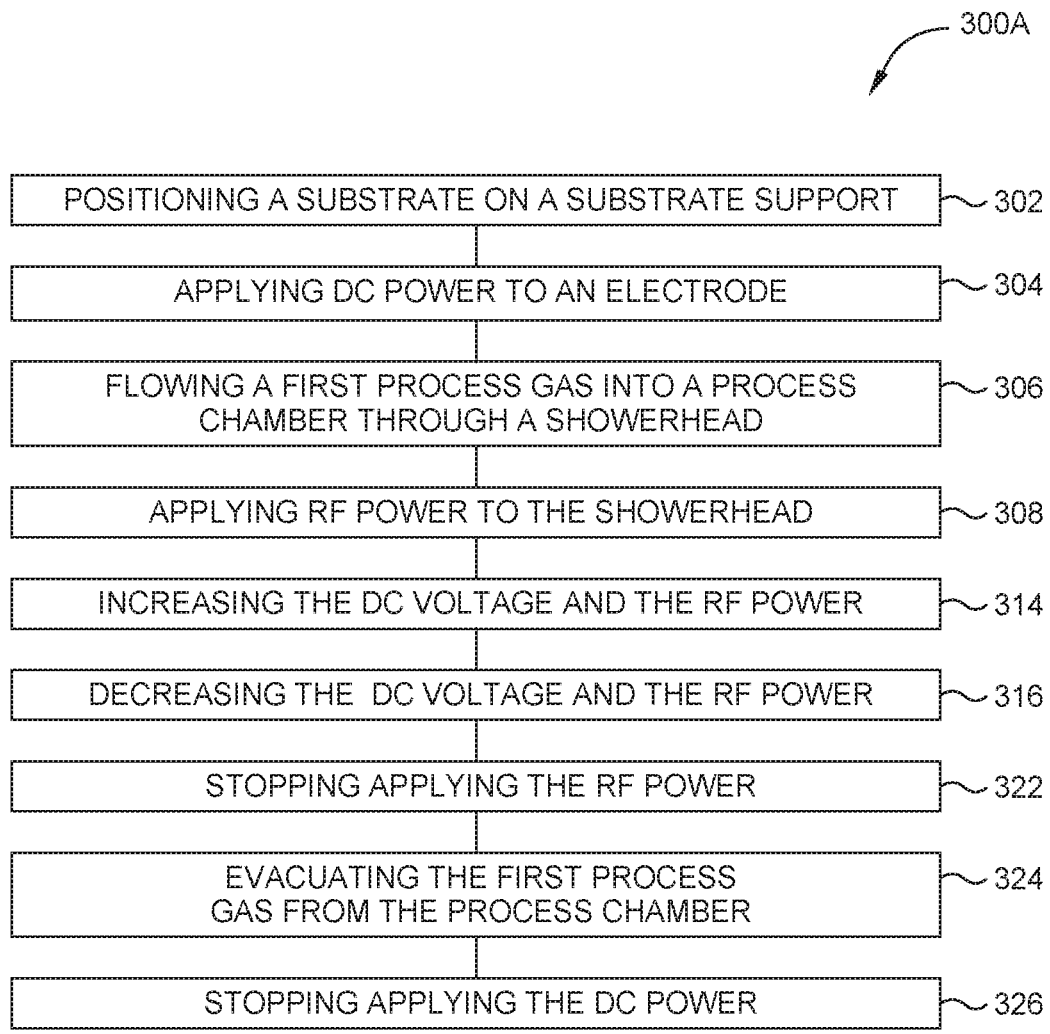
FIGS. 3A-3B depicts methods 300A and 300B according to embodiments described herein.

FIG. 3A depict a method 300A according to embodiments described herein. In operation 302, the substrate 107 is positioned on the pedestal 104 in the process chamber 100. During the positioning of the substrate 107 on the pedestal 104, the pedestal 104 is at a substrate receiving position and the substrate 107 is at a pre-process position. When the pedestal 104 is in the substrate receiving position, the pedestal is spaced from the gas distributor at a distance of about 3500 mils to about 5000 mils, such as about 3750 mils to about 4750 mils, such as about 4000 mils to about 4500 mils. While the substrate 107 is being positioned on the pedestal 104, the process chamber 100 is purged using a purging process gas. Purging the process chamber 100 removes unwanted gasses and contaminants from the process volume, and fills the process chamber with the purging process gas, which has a high threshold energy of ionization. The purging process gas is introduced at a rate of about 1000 sccm to about 3000 sccm, such as about 1500 sccm to about 2500 sccm. The introduction of the purging process gas is tapered and then stopped towards the end of the operation 302 and after the substrate 107 has been placed on the pedestal 104.

In operation 304, the electric power source 132 is turned on after operation 302. In operation 304, the process chamber 100 is filled with a first process gas, such as a helium gas from operation 302. The electric power source 132 is a DC power source, which applies a DC voltage to the electrode 128 within the pedestal 104 and chucks the substrate 107 to the patterned surface 142. The DC voltage may be a first DC voltage level of about 300 volts to about 1000 volts, such as about 300 volts to about 600 volts, such as about 300 volts to about 500 volts, such as about 350 volts to about 450 volts, such as about 400 volts. Chucking the substrate 107 before the subsequent operations in this method provides the advantage of controlling the position of the substrate 107 and helps prevent the substrate 107 from moving. Stability of the substrate 107 prevents backside damages that may occur when the substrate 107 moves, as movement causes force between the posts 210 on the patterned surface 142 and the substrate 107. DC voltages disclosed herein mitigate undesirable electrostatic discharge of the first process gases within the process chamber and further introduced in operation 306, particularly in combination with other disclosed process parameters, such as gas composition, internal chamber pressure, and substrate spacing.

In operation 306, one or more first process gases are flown into the process chamber 100 through the gas distributor 112. Operation 306 is performed after operation 304. The first process gases may include helium or other similar process gases. Using helium gas provides the advantage of having higher thermal conductivity which helps planarize local temperature variations on the patterned surface 142, which can help prevent backside damages through uniform thermal expansion. It is contemplated there are other process gasses capable of being utilized in place of helium as the first process gas. The first process gases have high threshold energy to eliminate ionization during substrate chucking. Helium gas provides a high bias breakdown medium for DC discharges, which improves stability when the pedestal 104 is spaced further apart from the gas distributor 112. Helium has been shown to have a drastically higher bias breakdown voltage than gasses such as argon when compared under process conditions similar to those described herein. When comparing the amount of defects on a substrate while using helium, it was found that the number of defects on the substrate can be reduced by between 90% and 95% when compared to using argon as the first process gas.

The first gas is introduced at a rate of about 1 sccm to about 10,000 sccm, such as about 1 sccm to about 4000 sccm, such as about 1000 sccm to about 3000 sccm, such as about 2000 sccm. In some embodiments, the flow rate of the process gas into the process chamber 100 during operation 306 may be ramped up from an initial flow rate of about 0 sccm to a final flow rate described in one of the ranges above. Ramping of the process gas further minimizes substrate movement.

During operation 306, the pressure within the chamber is increased to a pressure of about 5 Torr to about 15 Torr, such as about 6 Torr to about 12 Torr, such as about 7 Torr to about 10 Torr. The pressure within the chamber is maintained at the pressure during substrate processing.

In operation 308, an electric power source 141 is turned on. Operation 308 is performed after operation 306. The electric power source 141 may be an RF generator which applies an RF power to the gas distributor 112. The RF power may be a first RF power level and is in the range of about 100 watts to about 6000 watts, such as about 150 watts to about 3000 watts, such as about 200 to about 2000 watts, such as about 250 to about 500 watts, such as about 350 watts. It is contemplated that the range of the first RF power level may be greater than about 6000 watts, such as greater than about 7000 watts, such as greater than about 8000 watts, such as greater than about 9000 watts, such as greater than about 10000 watts. In some embodiments, the first RF power level is greater than about 100 watts, such as greater than about 150 watts, such as greater than about 200 watts, such as greater than about 250 watts. In some embodiments, the range of the first RF power level is about 100 watts to 8000 Watts, such as about 150 watts to about 6000 Watts, such as about 200 watts to about 5000 Watts, such as about 250 watts to 2000 Watts.

In operation 314, both the DC voltage and RF power are increased to a second DC voltage level and a second RF power level when substrate processing is performed on the substrate 107. Substrate processing may include deposition processes or treatment processes. In some embodiments, the substrate 107 is subject to an oxidation process. In embodiments in which operation 310 (FIG. 3B) and operation 312 (FIG. 3B) are utilized, the DC voltage and RF power may be increased subsequent to either operation 310 or operation 312. In embodiments in which operation 310 and operation 312 are not utilized, the DC voltage and RF power may be increased subsequent to operation 308. The second DC voltage level is about 800 volts to about 1100 volts, such as about 900 volts to about 1050 volts, such as 950 volts to about 1000 volts. In some embodiments, the second DC voltage level may be about 980 volts. The RF power is increased to a second RF power level. The second RF power level is about 1000 watts to about 6000 watts, such as about 1000 watts to about 4000 watts, such as about 2000 watts to about 3000 watts, such as about 2250 watts to about 2750 watts. In some embodiments, the second RF power level may be about 2450 watts. In some embodiments, the second RF power level is greater than about 6000 watts, such as greater than about 7000 watts, such as greater than about 8000 watts, such as greater than about 9000 watts, such as greater than about 10000 watts. In some embodiments, the range of the RF power is about 1000 watts to about 5000 Watts, such as about 1500 watts to about 5000 Watts, such as about 2000 watts to about 4000 Watts. The substrate processing is performed during or after the DC voltage and the RF power are increased to a second DC voltage level and a second RF power level. In some embodiments, the substrate processing is performed both during and after the DC voltage and the RF power are increased to the second DC voltage level and the second RF power level.

In operation 316, both the DC voltage and RF power are decreased to a third DC voltage level and a third RF power level. The decrease in the DC voltage and RF power is accompanied by a cease of the substrate processing performed on the substrate 107 in operation 314. In some embodiments, which may be combined with other embodiments, the DC voltage and RF power are decreased after substrate processing is performed so that the third DC voltage level and the third RF power level are at the same DC voltage and RF power levels as the first DC voltage level and the first RF power level of operation 314. The third DC voltage level is about 300 volts to about 1000 volts, such as about 300 volts to about 600 volts, such as about 300 volts to about 500 volts, such as about 350 volts to about 450 volts, such as about 400 volts. The third RF power level is about 100 watts to about 6000 watts, such as about 150 watts to about 3000 watts, such as about 200 to about 2000 watts, such as about 250 to about 500 watts, such as about 350 watts. It is contemplated that the range of the third RF power level may be greater than about 6000 watts, such as greater than about 7000 watts, such as greater than about 8000 watts, such as greater than about 9000 watts, such as greater than about 10000 watts. In these embodiments, at this stage in the method 300, the amount of RF power being supplied is higher than the RF power supplied in conventional methods, which provides a more stable transition from the higher RF power used when the substrate processes performed. This facilitates improved temperature stabilization to prevent backside damages.

In operation 322, the power source 141 is turned off, such that the application of RF power to the gas distributor 112 is ceased. By turning off the RF power, the plasma creation within the process chamber 100 may be halted.

In operation 324, the flow of the first gas into the process chamber is ceased. The first gas may be removed from the process chamber 100 in operation 324. The first gas is removed from the process chamber 100 while DC power is still being supplied to the electrode 128 within the pedestal 104. By ceasing the flow of the first gas while DC power is being supplied to the electrode 128, the movement of the substrate 107 caused by the evacuation of the process chamber 100 is minimized. The pressure within the process chamber 100 during operation 324 may be substantially reduced to a near-vacuum pressure. Operation 324 is performed subsequent to operation 322. Also during the removal of the first gas from the process chamber 100, the pressure within the process chamber 100 decreases. The pressure within the process chamber 100 decreases to a predetermined pressure, such as less than about 5 Torr, such as less than about 3 Torr, such as less than about 2 Torr, such as less than about 1 Torr.

In operation 326, the power source 132 is turned off subsequent to operation 324. When the power source 132 is turned off, the application of the DC voltage is stopped and the chucking of the substrate 107 on the patterned surface is ceased. Once the chucking of the substrate 107 has ceased, the substrate 107 may be removed from the patterned surface 142.

Figure 3B:
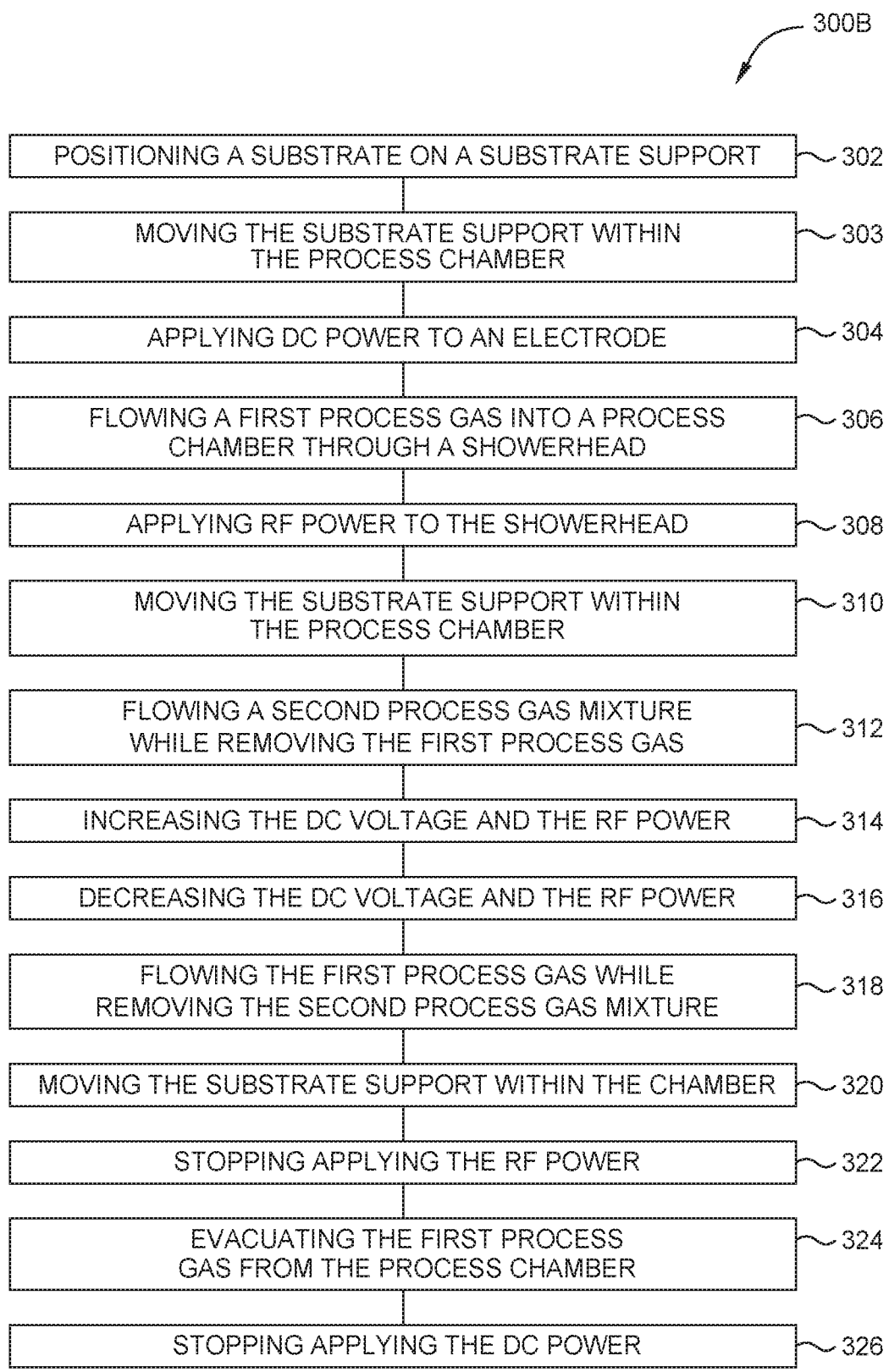

FIG. 3B depict a method 300B according to embodiments described herein. The method 300B of FIG. 3B is similar to the method 300A of FIG. 3A, but may include several additional process operations, such as operation 303, operation 310, operation 312, operation 318, and operation 320 as described herein.

In optional operation 303 (FIG. 3B), the pedestal 104 is moved from a substrate receiving position to a first spacing from the gas distributor. The first spacing is about 200 mils to about 3000 mils, such as about 200 mils to about 1000 mils, such as about 450 mils to about 750 mils from the gas distributor 112. In some embodiments, the pedestal 104 is spaced about 550 mils from the gas distributor 112, although other positions are also possible. The selected spacing facilitates chucking of a substrate without inadvertent plasma generation.

In optional operation 310 (FIG. 3B), the pedestal 104 is moved within the process chamber 100 to be positioned closer to the gas distributor 112. Operation 310 is performed between operation 308 and operation 310 as previously described. In this embodiment, the pedestal 104 is moved to a second spacing. The second spacing is between about 200 mils to about 400 mils from the gas distributor 112, such as about 250 mils to about 350 mils, such as about 300 mils from the gas distributor 112.

Operation 312 is performed subsequent to or simultaneously with operation 310. In optional operation 312 (FIG. 3B), a second process gas mixture is flowed into the process chamber 100 through the gas distributor 112 while the flow of the first process gas into the process chamber 100 is stopped. In some embodiments, the first process gas may be removed from the process chamber 100 during this operation. The second process gas mixture includes one or more of carrier gases and process/deposition gases, such as a mixture of argon and propene. Other carrier gases and process/deposition gases may also be used, such as nitrogen, ethylene, oxygen, tungsten hexafluoride, diborane, tungsten, pentacarbonyl 1-methylbutylisonitrile, silane, or nitrous oxide. The second gas mixture is flowed into the process chamber 100 at a rate of about 1 sccm to about 10000 sccm, such as about 1 sccm to about 4000 sccm, such as about 1000 sccm to about 4000 sccm, such as about 2500 sccm.

In some exemplary embodiments which may be combined with other embodiments, the ramping of the second gas mixture flow into the process chamber 100 is about 10 sccm/s to 1000 sccm/s. In some embodiments, the flow rate of the first gas into the process chamber 100 is decreased by the same rate that the flow rate of the second gas mixture flow is increased. This enables the pressure within the process chamber 100 to be kept constant during the transition from the first gas to the second gas mixture flow.

In embodiments where the second gas mixture is a mixture of argon and propane, the ratio of argon gas to propane gas flown into the process chamber 100 may be between about 3:1 and about 10:1, such as about 4:1 and about 8:1, such as about 5:1 and about 7:1. In embodiments in which other precursor gases are used, a similar ratio of inert gas to reactant gas may be utilized.

In some embodiments which may be combined with other embodiments, operation 310 and operation 312 may be performed simultaneously, such that the second gas mixture is introduced while the pedestal 104 is moved to a new position.

Operation 318 is performed subsequent to operation 316 and prior to operation 320. In operation 318, the first gas mixture is flown into the process chamber 100 through the gas distributor 112 while the second gas mixture is removed from the process chamber 100. By the end of operation 318, the flow rates of both the first gas mixture and the second gas mixture are the same as the flow rates utilized in operation 306. In some embodiments, the flow rate of the second gas mixture within the process chamber 100 may be about 0 sccm or near about 0 sccm by the end of operation 318. The first gas mixture can flow at a rate of about 1 sccm to about 10,000 sccm, such as about 1 sccm to about 4000 sccm, such as about 1000 sccm to about 3000 sccm, such as about 2000 sccm by the end of operation 318.

In optional operation 320, the pedestal 104 is moved within the process chamber 100 to be at a third spacing, further from the gas distributor 112 than the second spacing. In some embodiments, the third spacing between the pedestal 104 and the gas distributor 112 is about 450 mils to about 750 mils, such as about 500 mils to about 700 mils, such as about 550 mils to about 650 mils, such as about 600 mils from the gas distributor 112. Operation 320 may be performed subsequent to or simultaneously with operation 318. Moving the pedestal 104 to the third spacing increases the breakdown potential required to arc DC plasma. By moving the pedestal 104 to a third spacing greater than the second spacing before operation 320, the plasma creation within the process chamber 100 is halted or reduced before operation 322 and the application of RF power is ceased.

Operations 302, 304, 306, 308, 310, 312, 314, 316, 318, 320, 322, 324, 326 are described as being completed in sequence with one another in method 300A and method 300B. In alternative embodiments, several of the operations of method 300A and method 300B may be performed simultaneously. In some embodiments, operation 310 and operation 312 are performed simultaneously. In some exemplary embodiments, operation 322 and operation 324 are performed simultaneously.

Turning off the DC chucking voltage, supplied by the power source 132, after turning off the RF power enables control of the position of the substrate 107 on the patterned surface 142 throughout operations 302, 304, 306, 308, 310, 312, 314, 316, 318, 310, 322, and 324. The position control helps stabilize the temperature of the substrate 107 relative to the patterned surface 142, helping prevent backside damages caused by the shifting of the substrate 107 during processing. Additionally, after the RF power is turned off, the DC chucking voltage remains elevated at the DC chucking voltage described in operation 316, which is sufficient to maintain the substrate 107 in position without discharging plasma. Another benefit of the methods described herein is the elapsed time to complete the process. One aspect of obtaining and maintaining thermal equilibrium is time. Position control is improved due to the chucking voltage being applied throughout operations 304, 306, 308, 310, 312, 314, 316, 318, 320, 322, and 324. Improved position control allows for the substrate 107 to be chucked and acted upon by a heater for a longer period of time. The extended time allows for a relaxation of the substrate 107 around the posts 210 and prevents backside damages.

It is beneficial to control the position of the substrate 107 on the patterned surface 142 for the operations 304-326. Previous attempts to chuck the substrate 107 before moving the substrate 107 to the second spacing results in DC based electrostatic discharge of the first gas. The electrostatic discharge of the first gas results in hardware damage and substrate defects. The methods presented herein prevent the electrostatic discharge of the first gas and allow for the substrate 107 to be chucked earlier in the method.

FIG. 4 is a graph 400 illustrating process parameter relations at operations within the methods disclosed herein. The graph 400 displays process conditions for spacing 402 between the pedestal 104 and the gas distributor 112, pressure 404 within the process chamber 100, flow rate of the first process gas 406, flow rate of the carrier gas 408, flow rate of the second process/deposition gas 410, the applied DC chucking voltage 412, and the applied RF power 414 during different times within the execution of the method described herein. The graph 400 displays process parameters for one embodiment of operations 302, 304, 306, 308, 310, 312, 314, 316, 318, 310, 322, 324, and 326. However, other process configurations are contemplated.

The graph 400 is only one exemplary embodiment of how process parameters and relationships of each process parameter may be utilized. In other embodiments, each parameter may follow a different path over time. In some embodiments, the slope of each parameter may be greater or less than the slope of the parameters disclosed herein. In some embodiments, the operations 302, 304, 306, 308, 310, 312, 314, 316, 318, 310, 322, 324, and 326 may be rearranged slightly and some operations may be performed simultaneously that are not disclosed in the graph 400.

The combination of the spacing, pressure, process gas, and chucking voltage utilized in the methods described herein allow for chucking of a substrate during the introduction and movement of the substrate. One or more combinations of these factors mitigates inadvertent plasma formation and electrostatic discharge adjacent to the substrate. Because inadvertent plasma formation and electrostatic discharge results in hardware damage and substrate defects, the methods herein provide improved processing over conventional methodologies. In aspects disclosed herein, spacing, pressure, gas composition, and/or the chucking voltage are controlled to prevent the process gas from arcing and inadvertently forming a plasma.

While the foregoing is directed to implementations of the present invention, other and further implementations of the invention may be devised without departing from the basic scope thereof, and the scope thereof is determined by the claims that follow.

We claim:

1. A method for processing a substrate within a process chamber, comprising:

applying a direct current to an electrode disposed within a pedestal on which the substrate is disposed within the process chamber;

flowing one or more first process gases comprising helium into the process chamber subsequent to applying the direct current to the electrode;

applying radio frequency (RF) power at a first RF power level to a showerhead within the process chamber, subsequent to flowing the one or more first process gases into the process chamber through the showerhead;

flowing one or more second process gases into the process chamber while removing the one or more first process gases from the process chamber;

applying a plasma generated from at least one of the one or more first process gases and the one or more second process gases to the substrate subsequent to applying the RF power at the first RF power level;

increasing the RF power to a second RF power level at least one of prior to or during the applying the plasma to the substrate;

flowing the one or more first process gases into the process chamber while removing the one or more second process gases from the process chamber subsequent to the increasing the RF power to the second RF power level;

stopping the application of the RF power subsequent to the applying of the plasma to the substrate;

removing the one or more first process gases from the process chamber subsequent to the stopping the application of RF power; and stopping the application of the DC power subsequent to the removing the one or more first process gases and subsequent to the stopping the application of RF power.

2. The method of claim 1, wherein applying the direct current to the electrode further comprises applying a DC voltage of 300 volts to 500 volts and applying the RF power to the showerhead further comprises applying power of 100 watts to 6000 watts.

3. The method of claim 2, wherein during the processing the substrate a pressure within the process chamber is 5 Torr to 15 Torr and a spacing between the showerhead and the pedestal is 450 mils to 750 mils.

4. A method for processing a substrate, comprising sequential operations of:
(a) positioning the substrate on a surface of a pedestal within a process chamber, wherein the pedestal is at a first spacing from a showerhead;
(b) applying a DC voltage at a first DC voltage level to an electrode disposed within the pedestal to chuck the substrate;
(c) flowing one or more first process gases comprising helium into the process chamber;
(d) applying an RF power at a first RF power level to the showerhead within the process chamber;
(e) flowing one or more second process gases into the process chamber while removing the one or more first process gases from the process chamber;
(f) increasing the DC voltage and the RF power to a second DC voltage level and a second RF power level at least one of prior to or during applying a plasma generated from at least one of the one or more first process gases and the one or more second process gases to the substrate;
(g) flowing the one or more first process gases into the process chamber while removing the one or more second process gases from the process chamber;
(h) decreasing the DC voltage and the RF power to a third DC voltage level and a third RF power level after the applying the plasma to the substrate;
(i) moving the pedestal within the process chamber to a second spacing from the showerhead;
(j) stopping the application of the RF power to the showerhead;
(k) removing the one or more first process gases from the process chamber; and
(l) stopping the application of the DC voltage to the electrode.

5. The method of claim 4, wherein the first spacing is 450 mils to 750 mils.

6. The method of claim 4, wherein the second spacing is 200 mils to 400 mils.

7. The method of claim 4, wherein the first DC voltage level is 300 volts to 500 volts.

8. The method of claim 4, wherein the first RF power level is greater than 100 volts.

9. The method of claim 4, wherein the second DC voltage level is 800 volts to 1100 volts.

10. The method of claim 4, wherein the second RF power level is greater than 1000 volts.

11. The method of claim 4, wherein a pressure within the process chamber during the substrate processing is 5 Torr to 15 Torr.

12. The method of claim 4, wherein the third DC voltage level is 300 volts to 500 volts.

13. A method for processing a substrate, comprising:
positioning the substrate on a surface of a pedestal, wherein the pedestal is at a first spacing from a showerhead within a process chamber;
applying a DC voltage at a first DC voltage to an electrode disposed within the pedestal;
flowing a first process gas comprising helium into the process chamber through the showerhead after the application of the DC voltage at a first DC voltage level;
applying radio frequency (RF) power to the showerhead within the process chamber at a first RF power level;
moving the pedestal to a second spacing from the showerhead, wherein the second spacing is closer to the showerhead than the first spacing;
flowing a second process gas mixture comprising at least one of tungsten hexafluoride, diborane, or tungsten pentacarbonyl 1-methylbutylisonitrile into the process chamber through the showerhead while removing the first process gas from the process chamber;
increasing the DC voltage and the RF power to a second DC voltage level and a second RF power level at least one of prior to or during applying a plasma generated from at least one of the first process gas and the second process gas mixture to the substrate;
decreasing the DC voltage and the RF power to a third DC voltage level and a third RF power level after the applying the plasma to the substrate;
flowing the first process gas into the process chamber through the showerhead while removing the second process gas mixture from the process chamber after the applying the plasma to the substrate;
moving the pedestal within the process chamber to a third spacing from the showerhead;
stopping the application of the RF power;
removing the first process gas from the process chamber after stopping the application of the RF power; and
stopping the application of the DC power after removing the first process gas from the process chamber and after stopping the application of the RF power.

14. The method of claim 13, wherein the pedestal is spaced apart from the showerhead between 450 and 750 mils at the first spacing.

15. The method of claim 14, wherein the first DC voltage level is 300 volts to 500 volts.

16. The method of claim 13, wherein a pressure within the process chamber during the substrate processing is 5 Torr to 15 Torr subsequent to flowing the first process gas into the process chamber.

17. The method of claim 15, wherein the second DC voltage level is 800 volts to 1100 volts and the second process gas mixture further comprises either argon, propene, or both argon and propene.

* * * * *